(12) United States Patent
Lilak et al.

(10) Patent No.: US 11,616,060 B2
(45) Date of Patent: Mar. 28, 2023

(54) TECHNIQUES FOR FORMING GATE STRUCTURES FOR TRANSISTORS ARRANGED IN A STACKED CONFIGURATION ON A SINGLE FIN STRUCTURE

(71) Applicant: INTEL CORPORATION, Santa Clara, CA (US)

(72) Inventors: Aaron D. Lilak, Beaverton, OR (US); Gilbert Dewey, Beaverton, OR (US); Willy Rachmady, Beaverton, OR (US); Rami Hourani, Portland, OR (US); Stephanie A. Bojarski, Beaverton, OR (US); Rishabh Mehandru, Portland, OR (US); Anh Phan, Beaverton, OR (US); Ehren Mannebach, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1098 days.

(21) Appl. No.: 16/024,080

(22) Filed: Jun. 29, 2018

(65) Prior Publication Data

US 2020/0006331 A1 Jan. 2, 2020

(51) Int. Cl.
*H01L 27/08* (2006.01)
*H01L 27/088* (2006.01)
(Continued)

(52) U.S. Cl.
CPC ...... *H01L 27/0886* (2013.01); *H01L 29/0649* (2013.01); *H01L 29/0847* (2013.01);
(Continued)

(58) Field of Classification Search
CPC ............ H01L 27/0886; H01L 29/0649; H01L 29/0847; H01L 29/1033; H01L 29/42356;
(Continued)

(56) References Cited

U.S. PATENT DOCUMENTS 9,947,670 B2 * 4/2018 Masuoka ............ H01L 27/0688
10,468,503 B1 * 11/2019 Balakrishnan ...... H01L 29/7884
(Continued)

FOREIGN PATENT DOCUMENTS

WO 2016204755 A1 12/2016
WO 2017095409 A1 6/2017
WO WO-2018101941 A1 * 6/2018 ....... H01L 21/02271

*Primary Examiner* — Mohammad M Hoque
(74) *Attorney, Agent, or Firm* — Schwabe, Williamson & Wyatt, P.C.

(57) ABSTRACT

A stacked transistor architecture has a fin structure that includes lower and upper portions separated by an isolation region built into the fin structure. Upper and lower gate structures on respective upper and lower fin structure portions may be different from one another (e.g., with respect to work function metal and/or gate dielectric thickness). One example methodology includes depositing lower gate structure materials on the lower and upper channel regions, recessing those materials to re-expose the upper channel region, and then re-depositing upper gate structure materials on the upper channel region. Another example methodology includes depositing a sacrificial protective layer on the upper channel region. The lower gate structure materials are then deposited on both the exposed lower channel region and sacrificial protective layer. The lower gate structure materials and sacrificial protective layer are then recessed to re-expose upper channel region so that upper gate structure materials can be deposited.

20 Claims, 11 Drawing Sheets

(51) Int. Cl.
*H01L 29/66* (2006.01)
*H01L 29/78* (2006.01)
*H01L 29/10* (2006.01)
*H01L 29/08* (2006.01)
*H01L 29/06* (2006.01)
*H01L 29/423* (2006.01)

(52) U.S. Cl.
CPC .... *H01L 29/1033* (2013.01); *H01L 29/42356* (2013.01); *H01L 29/66795* (2013.01); *H01L 29/7855* (2013.01); *H01L 2029/7858* (2013.01)

(58) Field of Classification Search
CPC ........... H01L 29/66795; H01L 29/7855; H01L 2029/7858; H01L 21/823807; H01L 21/823431; H01L 21/823462; H01L 21/823842; H01L 27/0688; H01L 27/092; H01L 29/0673; H01L 29/401; H01L 29/42376; H01L 29/42392; H01L 29/66439; H01L 29/66545; H01L 29/775; H01L 29/78696; H01L 27/1207; B82Y 10/00

USPC ....................................................... 257/401
See application file for complete search history.

(56) References Cited

U.S. PATENT DOCUMENTS

| | | | |
|---|---|---|---|
| 2011/0012085 A1* | 1/2011 | Deligianni | H01L 29/78642 257/E21.409 |
| 2013/0015500 A1* | 1/2013 | Izumida | H01L 29/42368 257/192 |
| 2014/0027860 A1 | 1/2014 | Glass et al. | |
| 2014/0159114 A1* | 6/2014 | Zheng | H01L 29/66477 438/585 |
| 2015/0187784 A1* | 7/2015 | Tan | H01L 29/40114 438/266 |
| 2016/0260802 A1 | 9/2016 | Glass et al. | |
| 2018/0166550 A1* | 6/2018 | Rodder | H01L 21/845 |
| 2019/0067280 A1* | 2/2019 | Balakrishnan | H01L 29/8083 |
| 2020/0066875 A1* | 2/2020 | Balakrishnan | H01L 29/7889 |

* cited by examiner

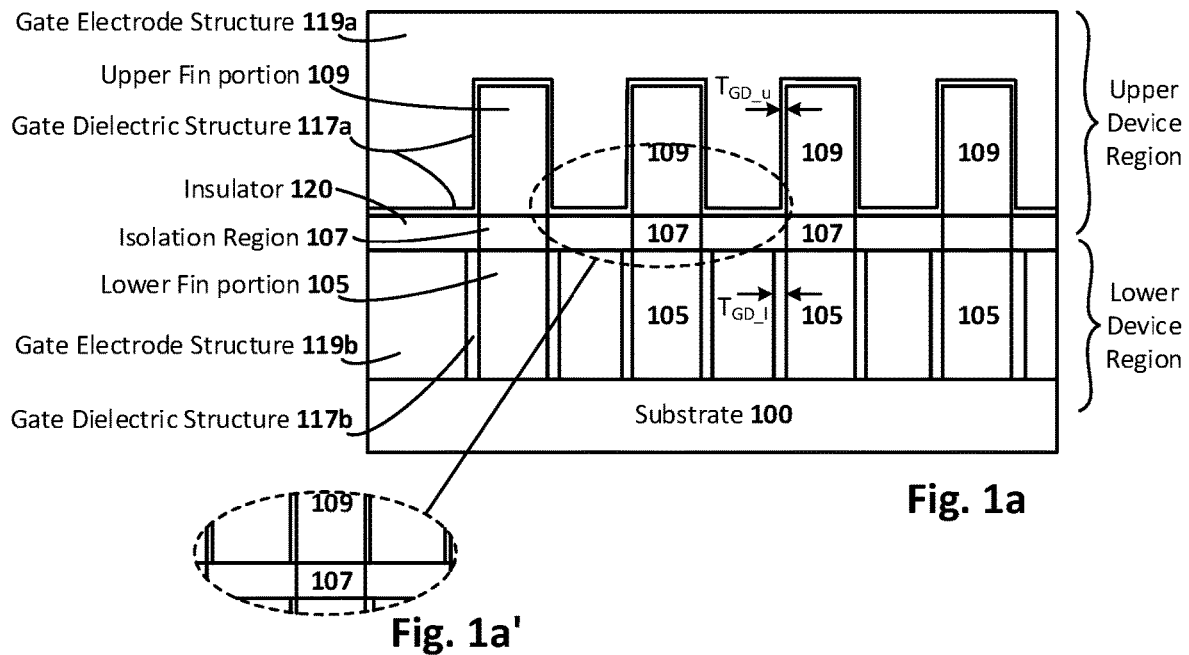
Fig. 1a
Fig. 1a'
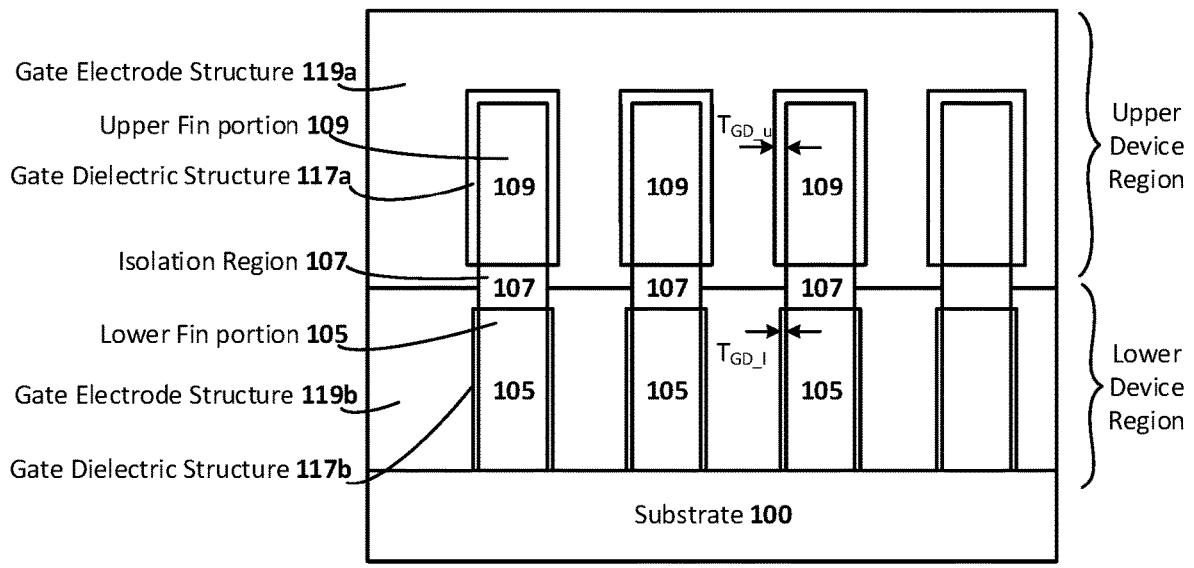
Fig. 1b

Fig. 2a  Fig. 2b  Fig. 2c  Fig. 2d  Fig. 2e

TECHNIQUES FOR FORMING GATE STRUCTURES FOR TRANSISTORS ARRANGED IN A STACKED CONFIGURATION ON A SINGLE FIN STRUCTURE

BACKGROUND

Integrated circuitry continues to scale to smaller feature dimensions and higher transistor densities. A more recent development with respect to increasing transistor density is generally referred to as three-dimensional (3D) integration, which expands transistor density by exploiting the Z-dimension (build upwards rather than laterally outwards in the X and Y dimensions). Some such 3D integrated circuits are monolithic in nature, in that they are formed utilizing a technique known as layer transfer. Such layer transfer may include, for instance, bond and hydrogen-based or hydrogen/helium based cleave techniques. Another means of performing layer transfer is to bond (such as with an oxide) two distinct wafers (sometimes referred to as host and donor wafers or substrates) and then perform a chemical-mechanical polish (CMP) operation to remove bulk of the bonded wafer leaving only a relatively thin region on the host wafer. This bond and polish operation may also utilize an etchstop embedded within the donor wafer. In any such cases, such 3D integration schemes give rise to a number of non-trivial issues which can cause degraded device performance and reliability.

BRIEF DESCRIPTION OF THE DRAWINGS

FIGS. 1a and 1b each illustrates a cross-section view of an integrated circuit including a stacked transistor configuration in which upper and lower regions of the same fin structure are used simultaneously for separate transistor devices, in accordance with an embodiment of the present disclosure. Multiple such fin structures are shown. The cross-section is taken parallel to the gate and through the gated channel regions.

FIGS. 2a through 2f illustrate cross-sections of example fin structures that can be used in a stacked transistor configuration in which upper and lower regions of the same fin structure are used simultaneously for separate transistor devices, in accordance with an embodiment of the present disclosure. The cross-sections are taken perpendicular to the fin structures.

Figure 2F:
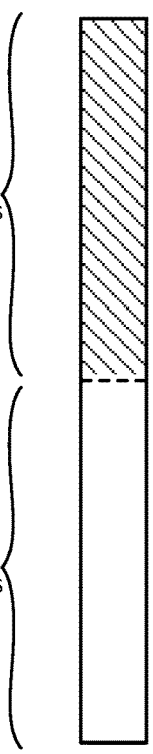
Figure 2F:
Figure 2F:
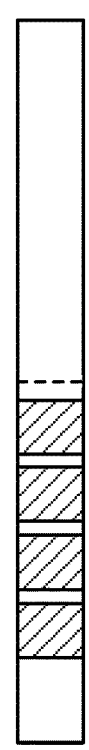
Figure 2F:
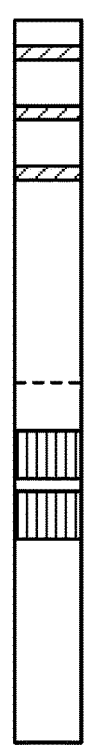
Figure 2F:
Figure 2F:
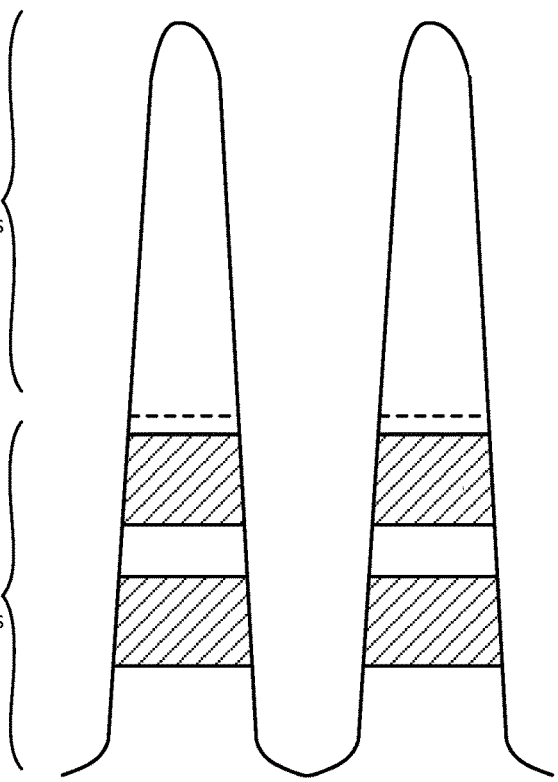

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

A stacked transistor architecture is disclosed that employs a common fin structure that includes lower transistor and upper transistor portions separated by an isolation region built into the fin structure. Upper and lower gate structures are provisioned on respective upper and lower transistor portions of the fin structure, and may be different from one another with respect to at least one of composition (e.g., with respect to work function metal) or geometry (e.g., with respect to gate dielectric thickness, or the underlying semiconductor region/fin in regard to width or height dimension). One example forming methodology includes depositing lower gate structure materials (gate dielectric and gate electrode) on the lower and upper channel regions, recessing those materials to re-expose the upper channel region, and then re-depositing the upper gate structure materials on the upper channel region. Another example forming methodology includes depositing a sacrificial protective layer on the upper channel region. The lower gate structure materials are then deposited on both the exposed lower channel region and the sacrificial protective layer. The lower gate structure materials and sacrificial protective layer are then recessed to re-expose the upper channel region so that upper gate structure materials can be deposited. In any such cases, note the diversity of the gate structure can be achieved with respect to each of the gate dielectric and the gate electrode. Further note that the gate dielectric materials can be deposited in a selective fashion (so as to primarily deposit only on the channel region, rather than other exposed surfaces), or a non-selective fashion. Numerous variations and embodiments will be appreciated.

General Overview

As previously explained, stacked transistor configurations are formed using layer transfer techniques which generally allow for upper and lower device regions to be formed separately and then subsequently joined together via a bonding process. In such cases, the upper and lower channel regions are separately formed and have an intervening bonding layer of some kind. Other stacked transistor forming methodologies also effectively provide independent upper and lower fin structures. In some cases, however, it may be desirable for the upper and lower channel regions to be part of the same fin structure. Unfortunately, such a configuration is challenging for a number of reasons. For instance, one limitation to integrating stacked transistors with a process in which the upper and lower regions of the same fin are used simultaneously for separate devices is the need to form an upper gate dielectric layer which is not adversely impacted by the processing required to fabricate the lower gate structure. This is because any damage to that upper gate dielectric layer can lead to unacceptable gate leakage on the upper device. Exacerbating this problem is that the gate dielectric layer can be relatively thin (e.g., 1 nm to 2 nm in thickness) and is therefore susceptible to damage caused by subsequent processing, such as when removing materials non-selectively deposited thereon but intended for the lower gate structure.

Thus, integrated circuits and forming techniques are disclosed herein having a common fin structure that is shared by upper and lower transistors arranged in a stacked configuration. In an embodiment, a stacked transistor architecture has a common fin structure that includes a lower transistor portion and an upper transistor portion that are separated by an isolation region built into the fin structure. The isolation region can be, for instance, an insulation layer or fixed charge isolation region of the fin structure. The lower transistor portion has a lower gate structure thereon, and the upper transistor portion has an upper gate structure thereon. The upper and lower gate structures may be different from one another in at least one respect, whether it be a compositional difference or a geometric difference or both. For instance, the gate electrode of the lower gate structure can be configured with NMOS work function metal, while the gate electrode of the upper gate structure can be configured with PMOS work function metal, or vice-versa. Alternatively, or in addition, the gate dielectric layer of the lower gate structure can have a thickness that is different from the gate dielectric layer thickness of the upper gate structure. For instance, the lower gate dielectric layer can be 2 nm to 5 nm, while the upper gate dielectric layer can be 1 nm 2 nm, or vice-versa.

In any such embodiments, such gate structure diversity with respect to upper and lower gate structures on the same fin can be achieved, for example, by first depositing the lower gate structure materials on both the lower and upper channel regions of the fin structure, and then performing a recess etch process to remove those materials from the upper region of the fin structure so as to re-expose the upper channel region. The upper gate structure, including a gate dielectric and gate electrode, can then be deposited using diverse materials and/or geometry. The gate dielectric can be any number of suitable gate dielectric materials, including high-k dielectric materials. The gate electrode may also be implemented with any number of suitable gate electrode materials. Note that the deposition process for the upper gate dielectric may be selective or non-selective. In some embodiments, an insulator layer may be provisioned on a top surface of the lower gate structure, prior to deposition of the upper gate structure materials, to electrically isolate to upper and lower gate structures.

In other such embodiments, gate structure diversity is achieved by first masking off the lower channel region and depositing a sacrificial protective layer on the upper channel region. The masking material can be, for instance, hardmask material. In other cases, the sacrificial protective layer is selectively deposited on the upper channel region, such that masking of the lower channel region can be avoided. The mask material (if present) is then removed to expose the lower channel region, and the lower gate structure materials are then deposited on both the exposed lower channel region and the sacrificial protective layer covering the upper channel region. Those lower gate structure materials, including gate dielectric and gate electrode materials, are then recessed along with the sacrificial protective layer to re-expose the upper channel region. The upper desired gate dielectric and gate electrode materials are then deposited, again using selective or non-selective deposition. As previously explained, in some embodiments, an insulator layer may be provisioned on a top surface of the lower gate structure, prior to deposition of the upper gate structure materials, to electrically isolate to upper and lower gate structures.

Thus, techniques are provided to integrate stacked transistors on single fin implementation without deleteriously impacting the upper transistor device, and particularly the upper gate dielectric. As will be further appreciated, the techniques allow for differing gate dielectric thicknesses to be used on the upper and lower devices formed on the same fin structure, according to some embodiments. Another advantage of some embodiments, and as will be appreciated in light of this disclosure, is that a selective high-k gate forming process as variously provided herein allows all three sides of the upper transistor channel region to be gated, including assemblies where the upper and lower gates are electrically connected. A non-selective process would typically enable just the sidewalls of the upper channel region to be gated. This is because an etch (such as a dry etch) intended to remove the high-k gate dielectric material non-selectively deposited on the horizontal surface of the exposed lower gate electrode would also remove the high-k gate dielectric from the top of the upper channel region, as will be appreciated. Further note that, in some example embodiments, the upper and lower gate structures will be electrically connected (e.g., such as for formation of an inverter CMOS circuit). So, in some such embodiments, having all three sides of the upper channel region being gated will advantageously provide increased drive capacity of the device. Other benefits and advantages will be apparent.

The top and bottom channel regions of the fin structure may be configured the same or differently, with respect to shape and/or semiconductor materials, and may further include fin-based channel regions, nanowire-based channel regions, or nanoribbon-based channel regions. For instance, in one example embodiment, the top channel region of the fin structure can be a fin portion of the fin structure and the bottom channel region can include one or more nanoribbons or nanowires included in the fin structure. In such cases, the nanoribbons or nanowires are released during gate processing by removing sacrificial material also included in the fin structure. In some such example cases, the top portion of the fin structure comprises, for instance, silicon germanium (SiGe) or germanium suitable for p-type metal oxide semiconductor (PMOS) devices, and the wires or ribbons of the lower portion of the fin structure comprise a group III-V semiconductor material such as indium gallium arsenide (InGaAs), indium arsenide (InAs), or gallium antimonide (GaSb) suitable for n-type metal oxide semiconductor (NMOS) devices. In another example embodiment, the top channel region is configured with a first fin portion of the fin structure comprising a first semiconductor material (e.g., SiGe), and the bottom channel region is configured with a second fin portion of the fin structure comprising a second semiconductor material (e.g., InGaAs) that is compositionally different from the first semiconductor material. Numerous variations and permutations will be apparent.

In any such cases, the resulting structure having top and bottom non-planar channel regions can be processed to form upper and lower non-planar transistor structures, such as FinFETs (tri-gate, double-gate) and gate-all-around transistor devices. In complementary metal oxide semiconductor (CMOS) configurations, one of the upper or lower transistors can be PMOS and the other of the upper or lower transistors can be NMOS. In other embodiments, the upper and lower transistors may be the same type (both PMOS or NMOS), depending on the integrated circuit being fabricated.

Gate-first and gate-last processes, as well as etch-and-replace epitaxial source and drain processes, may be used, as will be appreciated. The top and bottom gate structures may be the same in some embodiments, and different in other embodiments such as in cases that utilize a CMOS configuration where, for example, the top gate structure has a p-type work function metal and the bottom gate structure has an n-type work function metal, or some other difference. In some example embodiments, for instance, the gate forming process includes a gate-last process wherein after the dummy gate materials are removed to expose the top and bottom channel regions of the stacked transistor structure, and then a first type of final gate structure is deposited over both the exposed top and bottom channel regions. The gate structure over the top channel region is then recessed down to the gate structure of the bottom channel region, thereby removing that gate structure from the top channel region. If electrical isolation between the upper and lower gate structures is desired, then a deposition of insulator material can be carried out followed by any recessing, so as to provide that isolation layer. The final upper gate structure can then be applied. In other embodiments, the final upper gate structure is applied and directly contacts the final lower gate structure.

Lower and upper source and drain processing may be carried out prior to formation of the final gate structures, but not necessarily in all cases (such as in gate-first processes). In any such cases, and according to some embodiments, the source and drain regions associated with the bottom and top channel regions can be processed using an etch and replace process to provide the desired epitaxial source and drain regions, followed by contact formation. Similar techniques to forming the gate structures as provided herein can be used in forming the source/drain regions, according to some embodiments, and as will be appreciated. Other embodiments may use standard or other source/drain processing. The top and bottom source and drain regions may be same or different, with respect to, for example, dopant type, dopant concentration, and/or semi conductor materials.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Note that the use of "source/drain" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

Architecture

FIGS. 1a and 1b each illustrates a cross-section view of an integrated circuit including a stacked transistor configuration in which upper and lower regions of the same fin structure are used simultaneously for separate transistor devices, in accordance with an embodiment of the present disclosure. The cross-section is taken parallel to the gate and through the gated channel regions. As can be seen, multiple fin structures are shown, generally extending above substrate 100. Each fin structure includes an upper fin portion 109 and a lower fin portion 105 separated by an isolation region 107. As can be further seen, the upper fin portions 109 are part of the upper device region and the lower fin portion 105 are part of the lower device region. A lower gate structure on the lower fin portions 105 includes gate dielectric 117b and gate electrode 119b, and an upper gate structure on the upper fin portions 109 includes gate dielectric 117a and gate electrode 119a. In the example embodiment shown in FIG. 1a, the upper and lower gate electrodes are electrically isolated from one another by insulator layer 120. In the example embodiment shown in FIG. 1b, there is no insulator layer 120, and the upper and lower gate electrodes are electrically connected to one another. Four fin structures are shown, but other embodiments may have any number of fin structures (e.g., one, two, ten, hundreds, thousands, etc). Likewise, the number of upper gate structures that are connected to the lower device layer can be vary from one embodiment to the next (other embodiments may only have select upper gate structures connected to lower gate structures or some other lower contact point). In addition, other embodiments may have nanowires rather than fins, or some other combination of fins, nanowires and/or nanoribbons, as will be appreciated in light of this disclosure.

The substrate 100 can be, for instance, a layer of silicon dioxide on a bulk silicon or gallium arsenide substrate, or the oxide layer of a semiconductor-on-insulator (SOI) substrate configuration, although any number of other configurations can be used as well, and as will be appreciated. In other embodiments, the substrate 100 can be a converted layer (e.g., a silicon layer that has been converted to silicon dioxide during an oxygen-based annealing process). In still other embodiments, the substrate 100 is a semiconductor substrate, such as a bulk silicon substrate, or some other suitable semiconductor material. Note, however, benefit of have an oxide or other insulator under the channel regions of the lower device region is to inhibit subchannel leakage, as will be appreciated. In other embodiments, the substrate 100 is optional or otherwise removed at some point in the process (e.g., after lower and upper device regions are formed so as to allow for further desired processing under the lower device region, such as formation of an interconnect layer, insulation layer, passivation layer, etch stop layer, or another device region).

The fin structures including fin portions 105 and 109 may be configured in any number of ways, as will be appreciated, including fins native to substrate 100, replacement fins or fin structures, and/or multilayer structures suitable for forming nanowires and nanoribbons. For example, fin portions 109 may comprise, for example, a first semiconductor material (e.g., silicon, germanium, SiGe, a semiconducting oxide such as indium gallium zinc oxide (IGZO), or other suitable group IV semiconductor material), while fin portions 105 may comprise a second semiconductor material (e.g., InGaAs, InAs, GaSb, a semiconducting oxide, or other suitable group III-V semiconductor material). Alternatively, fin portions 105 and 109 may comprise the same semiconductor materials and configuration. FIGS. 2a-2f show various example fin structures, and will be discussed in turn. As will be appreciated, any such structures can be substituted into FIGS. 1a-b.

As previously explained, isolation 107 electrically isolates the upper and lower fin portions 105 and 109, and can be implemented, for example, with an insulator layer (e.g., oxide or nitride) between layers 105 and 109, or by way of doping or fixed charge isolation. Insulator 120 adjacent isolation 107 can be any suitable insulator material, such as silicon dioxide, silicon nitride, silicon carbide, silicon oxynitride, a polymer, a porous version of any of these, or any combination of these (e.g., upper portion of silicon oxide and a lower portion of silicon nitride, or vice-versa). In some embodiments, isolation 107 and insulator 120 are the same material, while in other embodiments they are compositionally different (e.g., so as to provide etch selectivity between the two materials, such as for an etch that removes insulator 120 but not isolation region 107, or vice-versa). Numerous such configurations and variations will be apparent in light of this disclosure.

In addition to gate dielectrics 117a-b and gate electrodes 119a-b, the upper and lower gate structures may further include gate spacers (hidden in the cross-section shown). Any number of gate structure configurations can be used. If present, the gate spacers may be, for example, silicon nitride or silicon dioxide or a carbon-doped oxide or an oxynitride or a carbon-doped oxynitride. The gate dielectrics 117a-b may be, for example, any suitable gate dielectric material(s) such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out to improve gate dielectric quality when a high-k material is used. Further, the gate electrodes 119a-b may comprise a wide range of suitable metals or metal alloys, such as aluminum, tungsten, titanium, tantalum, copper, titanium nitride, ruthenium, or tantalum nitride, for example.

In some embodiments, the gate dielectrics 117a-b and/or gate electrodes 119a-b may include a multilayer structure of two or more material layers or components. For instance, in one such embodiment, the gate dielectric structures 117a or 117b (or both) is a bi-layer structure having a first dielectric material (e.g., silicon dioxide) in contact with the corresponding channel region and a second dielectric material (e.g., hafnium oxide) in contact with the first dielectric material, the first dielectric material having a dielectric constant that is lower than the dielectric constant of the second dielectric material. Likewise, the gate electrode structures 119a or 119b (or both) may include a central metal plug portion (e.g., tungsten) with one or more outer work function layers and/or barrier layers (e.g., tantalum, tantalum nitride, an aluminum-containing alloy), and/or a resistance reducing cap layer (e.g., copper, gold, cobalt, tungsten). In some embodiments, the gate dielectrics 117a-b and/or gate electrodes 119a-b may include grading (increasing or decreasing, as the case may be) of the concentration of one or more materials therein.

Further note that the gate structure of the upper device region may be the same as the gate structure of the lower device region, or different. In some example embodiments, for instance, the gate electrode 119a of the upper gate structure includes a p-type work function metal suitable for PMOS devices, while the gate electrode 119b of the lower gate structure includes an n-type work function metal suitable for NMOS devices. Likewise, the gate dielectric 117a of the upper gate structure may include a first gate dielectric material, while the gate dielectric 117b of the lower gate structure includes a second gate dielectric material compositionally different from the first. In addition, or alternatively, the gate dielectric 117a of the upper gate structure may have a first thickness (indicated as $T_{GD\_u}$), while the gate dielectric 117b of the lower gate structure has a second thickness (indicated as $T_{GD\_l}$) that is different from the first thickness. FIG. 1a shows a $T_{GD\_u}$ that is less than $T_{GD\_l}$, while FIG. 1b shows a $T_{GD\_u}$ that is greater than $T_{GD\_l}$. In some example embodiments, $T_{GD\_u}$ is at least 0.5, 1, 1.5, 2, 2.5, or 3 nm greater than $T_{GD\_l}$. In other example embodiments, $T_{GD\_l}$ is at least 0.5, 1, 1.5, 2, 2.5, or 3 nm greater than $T_{GD\_u}$. In any such case, the upper and lower gate dielectric structures may be employed with intentionally different thicknesses to be tuned for different types of transistor devices. For instance, the relatively thicker gate dielectric may be used for a high voltage transistor device, while the relatively thinner gate dielectric may be used for a logic transistor device.

Other variations on gate structure will be apparent. For instance, in the example embodiment shown in FIG. 1a, the gate dielectric 117a is on insulator layer 120. In other embodiments such as shown in FIGS. 1a' and 1b, gate dielectric 117a may be selectively deposited only on the semiconductor material of fin portion 109 or otherwise removed from insulator layer 120 if non-selective deposition is used. With further reference to FIG. 1b, where there is no insulator layer 120, note that the various sidewalls of isolation region 107 material are not covered with gate dielectric 117a material. Numerous gate structure configurations can be used along with the forming techniques provided herein as will be appreciated, and the present disclosure is not intended to be limited to any particular such configurations.

Source and drain regions are not expressly shown in the cross-sections depicted, but will be apparent. For instance, in FIGS. 1a and 1b, if the cross-section were through the source/drain region rather than the channel region, semiconductor bodies 105 and 109 could be for example highly doped epitaxial source and drain regions, and features 117a-b could be source/drain liners or resistance reducing layers or some other feature attributable to the source/drain region (or a contact structure thereon). Likewise, features 119a-b could be source/drain contact structures (e.g., metal plug and barrier layer, or other contact structure configuration). Numerous source/drain configurations can be used, and the present disclosure is not intended to be limited to any particular ones.

In some example embodiments, the source/drain regions are epitaxial source/drain regions that are provided after the relevant portion of the fin or fin structure was isolated and etched away or otherwise removed. The source/drain material can therefore be compositionally different from the underlying fin structure or substrate 100 material and/or the channel material. In other embodiments, the source/drain regions may be doped portions of the fin or fin structure, rather than epi source/drain regions. In some embodiments using an etch and epitaxial replacement process, the source/drain regions are faceted and overgrown from a trench within insulator material (e.g., shallow trench isolation, or so-called STI), and the corresponding source or drain contact structure lands on that faceted excess portion. Alternatively, in other embodiments, the faceted excess portion of epi source/drain regions can be removed (e.g., via chemical mechanical planarization, or CMP), and the corresponding source or drain contact structure lands on that planarized portion. As will be further appreciated, in some embodiments, the removal of the original source/drain regions and replacement with epi source/drain material may result in an upper portion of the source/drain region (the overgrowth portion of the epi deposition) which is wider (e.g., by 1-10 nm) than the underlying fin structure width. Any combination of such features may result.

If present, epi source/drain regions can be any suitable semiconductor material. For instance, PMOS source/drain regions may include, for example, group IV semiconductor materials such as silicon, germanium, SiGe, germanium tin (GeSn), SiGe alloyed with carbon (SiGe:C). Example p-type dopants in silicon, SiGe, or germanium include boron, gallium, indium, and aluminum. NMOS source/drain regions may include, for example, group III-V semiconductor materials such as two or more of indium, aluminum, arsenic, phosphor, gallium, and antimony, with some example compounds including but not limited to indium aluminum arsenide (InAlAs), indium arsenide phosphide (InAsP), InGaAs, indium gallium arsenide phosphide (InGaAsP), gallium antimonide (GaSb), gallium aluminum antimonide (GaAlSb), indium gallium antimonide (InGaSb), or indium gallium phosphide antimonide (InGaPSb). In some specific such example embodiments, for instance, substrate 100 material is germanium, and source/drain regions 105 comprise SiGe (e.g., $Si_{1-x}Ge_x$ where $0.20 \leq x \leq 0.99$; or $Si_xGe_y:C_z$ where $8 \leq x \leq 16$; $80 \leq y \leq 90$; $1 \leq z \leq 4$; x+y+z=100). In another embodiment, substrate 100 material could be, for instance, $In_xGa_{1-x}As$ $0.51 \leq x \leq 0.55$; $0.10 \leq y \leq 1.00$ or InAs, and source/drain regions 105 comprise an indium-containing compound (e.g., $In_yAl_{1-y}As$ where $0.60 \leq y \leq 1.00$; or $InAs_yP_{1-y}$ where $0.10 \leq y \leq 1.00$; $In_yGa_{1-y}As_zP_{1-z}$ where $0.25 \leq y \leq 1.00$ and $0.50 \leq z \leq 1.00$; $In_xGa_{1-x}Sb$ where $0.25 \leq x \leq 1.00$, or $In_xGa_{1-x}P_ySb_{1-y}$ where $0.25 \leq x \leq 1.00$; $0.00 \leq y \leq 0.10$). Example N-type dopants include phosphorus, arsenic, and antimony. In a more general sense, source/drain regions can be any semiconductor material suitable for a given application.

In some cases having epi source/drain regions, the epi source/drain regions may include a multilayer structure, such as a germanium cap on a SiGe body, or a germanium body and a carbon-containing SiGe spacer or liner between the corresponding channel region and that germanium body. In any such cases, a portion of the epi source/drain regions may have a component that is graded in concentration, such as a graded germanium concentration to facilitate lattice matching, or a graded dopant concentration to facilitate low contact resistance. Any number of source/drain configurations can be used as will be appreciated in light of this disclosure, and the present disclosure is not intended to be limited to any particular such configurations.

Source and drain contact structures can also be included in the final structure, as will be further apparent. Source/drain contact structures can have any number of standard configurations. In some example embodiments, the contact structures include a contact metal and a conductive liner or barrier layer, deposited in a contact trench formed in an insulator layer over the source and drain regions. The liner can be, for example, tantalum or tantalum nitride, and metal can be any suitable plug/core material, such as tungsten, aluminum, ruthenium, cobalt, copper, or alloys thereof. In some cases, the contact structures can be optimized p-type and n-type contact structures similar to p-type and n-type gate electrode structures. For instance, according to some such embodiments, the liner can be titanium for NMOS source/drain contact structures, or nickel or platinum for PMOS source/drain contact structures. In still other embodiments, the contact structures may include resistance reducing materials (e.g., nickel, platinum, nickel platinum, cobalt, titanium, germanium, nickel, gold, or alloys thereof such as germanium-gold alloy, or a multilayer structure of titanium and titanium nitride all have good contact resistance), in addition to contact metal and any liner. Other embodiments may be configured differently. In a more general sense, any number of suitable source/drain contact structures can be used in accordance with an embodiment of the present disclosure, as will be appreciated, and the present disclosure is not intended to be limited to any particular such contact structure configurations.

The integrated circuits including the stacked transistor architecture as shown in FIGS. 1a-b may include other features as well, as will be appreciated. For example, the structures may further include interconnect features and layers. For instance, a first vertical interconnect feature can be provisioned that connects a given upper source or drain region to the corresponding lower source or drain region. Such interconnect features can be provisioned, for example, via standard lithographic and masking operations. Further note that while the fin structures are shown with an idealized state (e.g., perfectly vertical sidewalls and perfectly horizontal tops and bottoms), all such geometry could be rounded or tapered or otherwise non-ideal. For instance, the fin structures could be trapezoidal in shape, or hourglass shaped, or some other shape, as a result of the forming processes.

FIGS. 2a through 2f illustrate cross-sections of example fin structures that can be used in a stacked transistor configuration in which upper and lower regions of the same fin structure are used simultaneously for separate transistor devices, in accordance with an embodiment of the present disclosure. The cross-sections are taken perpendicular to the fin structures. As can be seen, each of the fin structures generally includes an upper fin region and a lower fin region. As can further be seen, each of these upper and lower fin regions may include a fin, or one or more nanowires (separated by sacrificial material), or one or more nanoribbons (separated by sacrificial material). In between the upper and lower fin regions is an isolation region, generally indicated with a dashed line. This isolation region corresponds to isolation region 107 of FIGS. 1a and 1b. The fin structures may have any number of geometries, but in some example cases are 50 nm to 250 nm tall (e.g., 55 nm to 100 nm), and 5 nm to 25 nm wide (e.g., 10 nm to 15 nm). The isolation region between the upper and lower fin regions may be implemented, for example, with an intervening insulation layer or doping integrated into either or both the upper or lower fin regions proximate the dashed line area. As will be appreciated, the use of terms like "above" "below" "upper" "lower" "top" and "bottom" are simply used to facilitate discussion and are not intended to implicate a rigid structure or fixed orientation; rather such terms are used interchangeably and generally indicate spatial relationships when the structure is in a given orientation.

FIG. 2a illustrates a fin structure having an upper fin region comprising a first semiconductor material, and a lower fin region comprising a second semiconductor material that is compositionally different from the first semiconductor material. FIG. 2b illustrates a fin structure having an upper fin region that includes four nanowires comprising a first semiconductor material (diagonal cross-hatching), and a lower fin region comprising a second semiconductor material (vertical cross-hatching) that is compositionally different from the first semiconductor material. Note that the nanowires are positioned in the fin structure so as to be closure to the top of the upper fin region. FIG. 2c illustrates a fin structure having an upper fin region comprising a first semiconductor material, and a lower fin region that includes four nanowires comprising a second semiconductor material (diagonal cross-hatching) that is compositionally different from the first semiconductor material. In this example case, note that the nanowires are positioned in the fin structure so as to be closure to the top of the lower fin region.

FIG. 2d illustrates a fin structure having an upper fin region that includes three nanoribbons comprising a first semiconductor material (diagonal cross-hatching), and a lower fin region that includes two nanowires comprising a second semiconductor material (vertical cross-hatching) that is compositionally different from the first semiconductor material. In this example case, note that the nanoribbons are positioned in the fin structure so as to be closure to the top of the upper fin region, and the nanowires are positioned in the fin structure so as to be closure to the top of the lower fin region. FIG. 2e illustrates a fin structure having an upper fin region comprising a first semiconductor material, and a lower fin region that includes four nanoribbons comprising a second semiconductor material (diagonal cross-hatching) that is compositionally different from the first semiconductor material. In this example case, note that the nanoribbons are positioned in the fin structure so as to be closure to the bottom of the lower fin region. Another example embodiment may be where the upper and lower fin regions of the fin structure are the same material (one continuous fin of the same semiconductor material), such as the lower region of FIG. 2a and the upper region of FIG. 2e, or the upper region of FIG. 2b and the lower region of FIG. 2c.

FIG. 2f shows a fin-pair, which includes two fin structures. Each fin structure can be configured in any number of ways, as indicated in the examples of FIGS. 2a-e. In this example case, each fin structure has an upper fin region comprising a first semiconductor material, and a lower fin region that includes two nanowires comprising a second semiconductor material (diagonal cross-hatching) that is compositionally different from the first semiconductor material. However, note the tapering of the fins. Further note the curved trough bottom between the fins, as well as the round top of the fin structure. Such tapering and rounding may result from the fin forming process.

Note that the example fin structures shown each includes an upper fin portion having opposing sidewalls and a lower fin portion opposing sidewalls, and the sidewalls of the upper fin portion are collinear with the sidewalls of the lower fin portion. This is one example sign that is indicative of a common or single fin structure that is being used for top and bottom transistor devices arranged in a stacked configuration, according to some embodiments provided herein. Other fin structure configurations may have curved or hourglass profiles, but still generally provide a degree of collinearity or self-alignment between the upper and lower fin portions, as will be appreciated.

Methodology

Figure 3A:
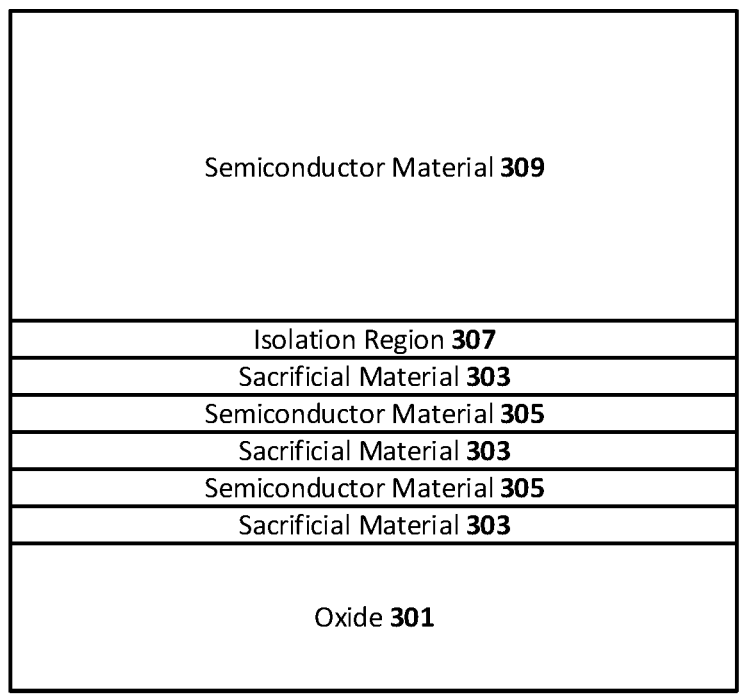
FIGS. 3a though 3h are cross-sections views illustrating a process for forming an integrated circuit including a stacked transistor configuration in which upper and lower regions of the same fin structure are used simultaneously for separate transistor devices, in accordance with an embodiment of the present disclosure. The cross-sections are taken perpendicular to the fin structures and through the channel region.

FIGS. 3a though 3h are cross-sections views illustrating a process for forming an integrated circuit including a stacked transistor configuration in which upper and lower regions of the same fin structure are used simultaneously for separate transistor devices, in accordance with an embodiment of the present disclosure. The cross-sections are taken perpendicular to the fin structures and through the channel region. As can be seen in the example embodiment of FIG. 3a, the process begins with providing alternating layers of sacrificial material 303 and semiconductor material 305 over an oxide layer 301. A semiconductor layer 309 is then provided on top of the alternating layer stack. Standard deposition techniques can be used to provide the various layers, such as chemical vapor deposition (CVD), physical layer deposition (PLD), a layer transfer process, and atomic layer deposition (ALD).

The resulting stack as well as the individual layers can have any number of thicknesses, and are not necessarily drawn to scale. For instance, in some such example embodiments, the oxide layer 301 is in the range of 30 to 500 nanometers (nm) thick, the relatively thin and alternating layers of sacrificial material 303 and semiconductor material 305 are each in the range of 5 to 40 nm thick, the isolation region 307 is in the range of 5 to 50 nm thick, and the semiconductor material layer 309 is in the range of 40 to 400 nm thick. In a more general sense, each of the layers may be set to any suitable thickness as will be appreciated in light of this disclosure.

The oxide layer 301 can be, for instance, a layer of silicon dioxide on a bulk silicon or gallium arsenide substrate, or the oxide layer of a semiconductor-on-insulator (SOI) substrate configuration, although any number of other configurations can be used as well, and as will be appreciated. In still other embodiments, the oxide layer 301 can be a converted layer (a silicon layer that has been converted to silicon dioxide during an oxygen-based annealing process). In other embodiments, the oxide layer 301 is optional and not used or otherwise present. The sacrificial material 303 can be any insulator or semiconductor material that can be selectively removed via a given etch chemistry with respect to the semiconductor material 305 used for the nanowires (i.e., the etch chemistry removes the sacrificial material 303 at a much higher rate than it removes the semiconductor material 305). Semiconductor materials 305 and 309 may be the same or different. Note that, the role of materials 303 and 305 can be reversed, depending on the type of transistor device being formed. For example: for PMOS transistors of a given integrated circuit, material 303 can be the sacrificial material and material 305 can be the semiconductor material used to make p-type nanowires or nanoribbons; and for NMOS transistors of that same given integrated circuit, material 303 can be the semiconductor material used to make n-type nanowires or nanoribbons and material 305 can be the sacrificial material. In such cases, the etch chemistry is chosen for its selectivity to the nanowire/nanoribbon material (the desired channel material), relative to the material that is to be removed or otherwise etched at a much higher rate (the sacrificial material).

The isolation region 307 can be, for example, a discrete layer of insulation material between upper layer 309 and lower layer 303. Alternatively, isolation region 307 can be a doped region of either (or both) of the adjacent upper layer 309 or lower layer 303. In any case, the doped region effectively impairs flow of carriers across that region 307, thereby inhibiting subchannel leakage or channel to channel leakage. In a more general sense, any isolation techniques and/or layers can be used to implement isolation region 307, as will be appreciated in light of this disclosure. In still other embodiments, there is no isolation region 307, because the upper most layer 303 will be removed as a sacrificial material, which also provides isolation between the upper and lower regions.

In one example embodiment, sacrificial material 303 is silicon dioxide, semiconductor 305 is silicon, isolation region 307 is silicon nitride, and semiconductor material 309 is germanium. In such a case, the resulting structure can have silicon nanowires or nanoribbons (formed from semiconductor layers 305) for NMOS devices in the lower region, and germanium fins (formed from semiconductor layer 309) for PMOS devices in the upper region. In another example embodiment, sacrificial material 303 is gallium arsenide (GaAs), semiconductor material 305 is InGaAs, isolation region 307 is silicon nitride, and semiconductor material 309 is germanium or SiGe. In such a case, the resulting structure can have InGaAs nanowires or nanoribbons (formed from semiconductor layers 305) for NMOS devices in the lower region, and germanium or SiGe fins (formed from semiconductor layer 309) for PMOS devices in the upper region. In a more general sense, layers 303, 305, and 307 can be any combination of materials that facilitate an etch electivity with respect to a given etch chemistry, to allow for release of the nanowires or nanoribbons in the upper and/or lower channel regions as well as electrical isolation between the upper and lower channel regions. Numerous such material systems will be apparent, including but not limited to group IV semiconductor materials and III-V semiconductor materials, to provide various PMOS and NMOS devices.

Figure 3B:
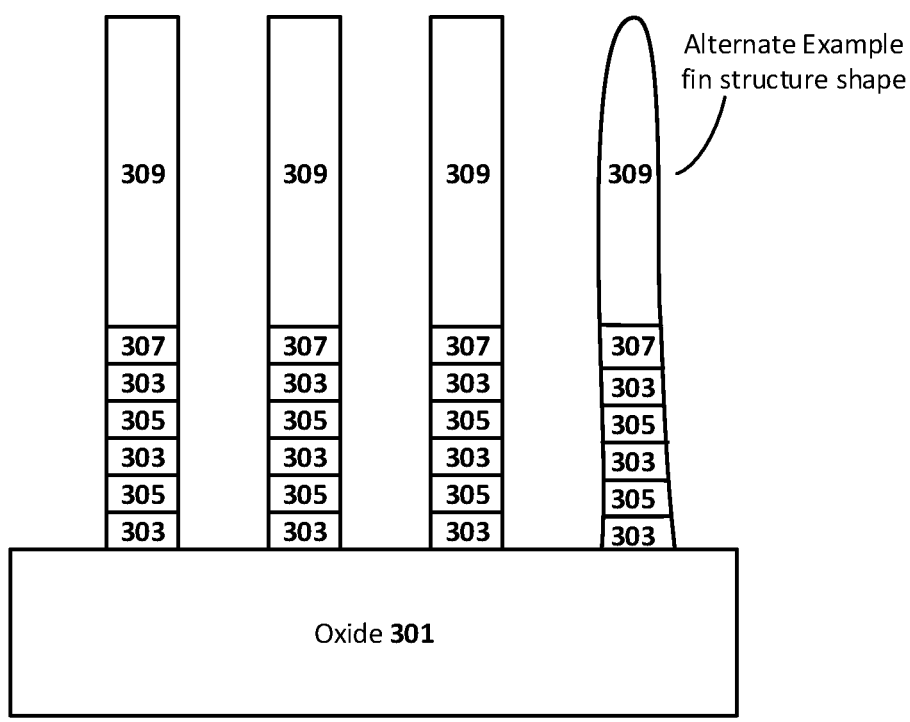

FIG. 3b shows the resulting structure after fin structures have been patterned and etched, according to an embodiment. As can be seen, four fin structures are shown, but any number of such fin structures can be made. Standard masking and etch techniques can be used, including wet and/or dry as well as isotropic and/or anisotropic etch schemes, as will be appreciated. Note the etch chemistry may change during the etch process to accommodate the change in materials making up the stack. As can be further seen, the recess etch stops on the oxide layer 301, but in other embodiments may continue into oxide layer 301 to some degree (e.g., 1 to 20 nm). Note that the three resulting example fin structures on the left side are shown with substantially vertical sidewalls. In other embodiments, the resulting fin structures may be tapered such that the thickness of layer 309 is less than the thickness of layers 303 and 305. Such tapering may be, for instance, a product of the etch scheme used and/or the height of the fin structure.

Now the resulting fin structures can be processed into devices, using gate-first or gate-last processing, source and drain processing, contact processing, and interconnect processing, as will now be discussed.

Figure 3C:
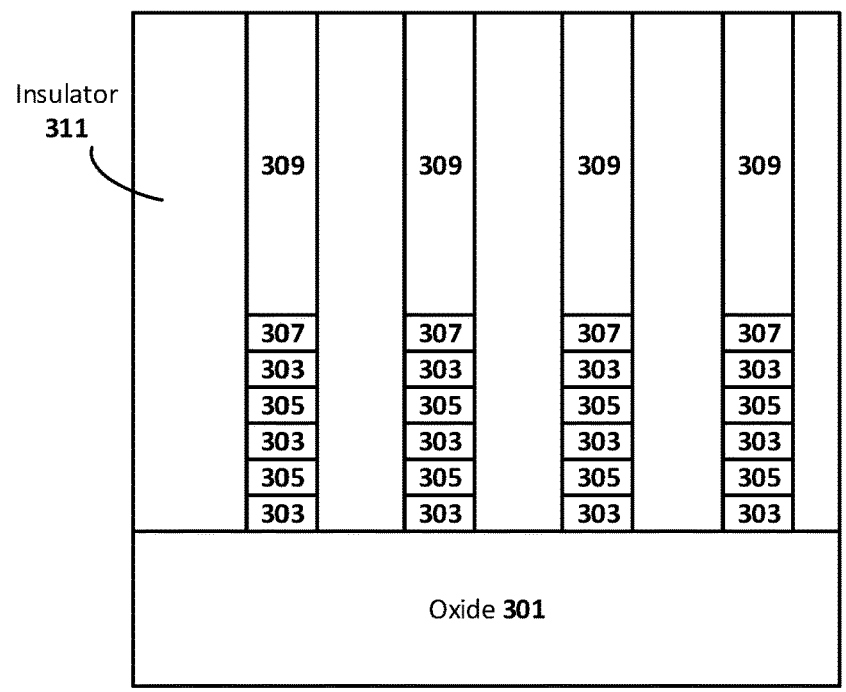

FIG. 3c shows the resulting structure after an insulator 311 is deposited into the trenches between the fin structures and planarized. Insulator 311 can be any suitable insulator materials, such as silicon dioxide, silicon nitride, silicon carbide, or a polymer. In some example cases, the insulator 311 is deposited as a flowable dielectric (e.g., flowable oxide, nitride, or carbide) and then cured. Such a flowable dielectric is particularly beneficial when the trenches being filled have a relatively high aspect ratio (e.g., 10:1 or more), as the flowable dielectric helps avoid pinch-off at that top of the trench (and the related void formation within the trench). The use of flowable dielectrics is also beneficial due to their low-temperature processing conditions, according to some such embodiments.

Figure 3D:
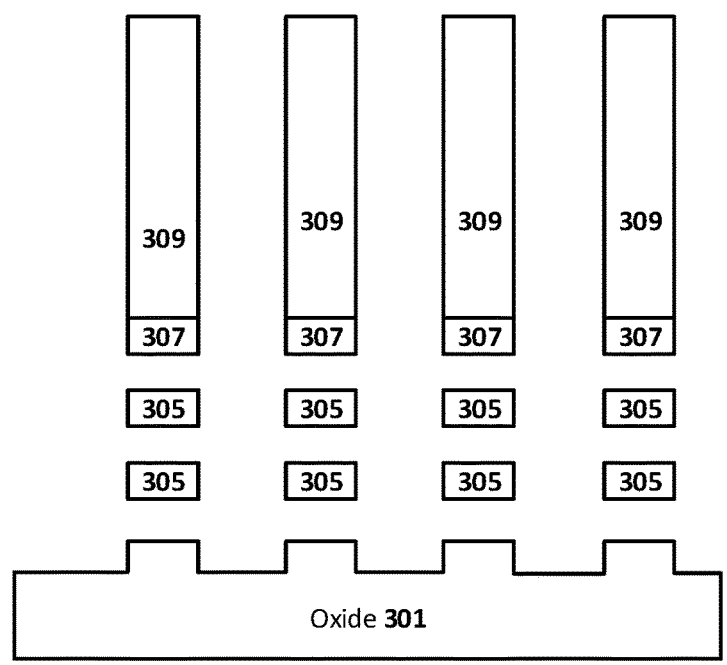

FIG. 3d shows the resulting structure after the insulator material 311 is removed or otherwise recessed, to provide access to the fin structures, particularly in the channel regions during dummy gate formation and/or final gate formation. The depth of the etch can vary from one embodiment to the next, and may extend into the oxide layer 301 (e.g., by 1 nm to 10 nm) as shown, although in other embodiments the etch may stop on the oxide layer 301 (or other underlying substrate). Assuming a gate-last process in accordance with one example embodiment, the source/drain regions would be formed at this point. As can be further seen, any dummy gate structure materials have been removed. So, in such cases, the exposed channel regions are shown in FIG. 3d. Also, as previously explained, in some such embodiments having a nanowire or nanoribbon configuration, recall that isolation region 307 may be omitted, because the upper most layer 303 is removed as a sacrificial material, which effectively may provide isolation between the upper and lower regions.

As can be further seen in FIG. 3d, the nanowires or nanoribbons 305 have been released in the channel region of the lower device region, by removing sacrificial material 303. As previously explained, that release process can be, for example, part of a gate forming process where the channel region is first exposed by removing any dummy gate materials (if a gate-last process is used), followed by an etch that is selective to the semiconductor 305 and not the sacrificial material 303 (i.e., the etch removes the sacrificial material 303 at a much higher rate than the semiconductor 305 material). Note that the release is only carried out in the channel region and not necessarily in the source or drain regions. Any number of selective etch schemes can be used, as will be appreciated. For instance, in one example embodiment sacrificial material 303 is silicon and semiconductor material 305 is germanium or SiGe, and etch chemistries such as aqueous hydroxide chemistries, including ammonium hydroxide and potassium hydroxide, for example, may be utilized to selectively etch the silicon but leave the germanium-containing nanowires or nanoribbons in place. In another example embodiment, sacrificial material 303 is germanium-containing material and semiconductor material 305 is silicon, and etch chemistries such as carboxylic acid/nitric acid/hydrogen fluoride chemistry, and citric acid/nitric acid/hydrogen fluoride, for example, may be utilized to selectively etch the germanium-containing material 303 but leave the silicon 305 in place. Any number of selective etch schemes can be used, as will be appreciated.

Figure 3E:
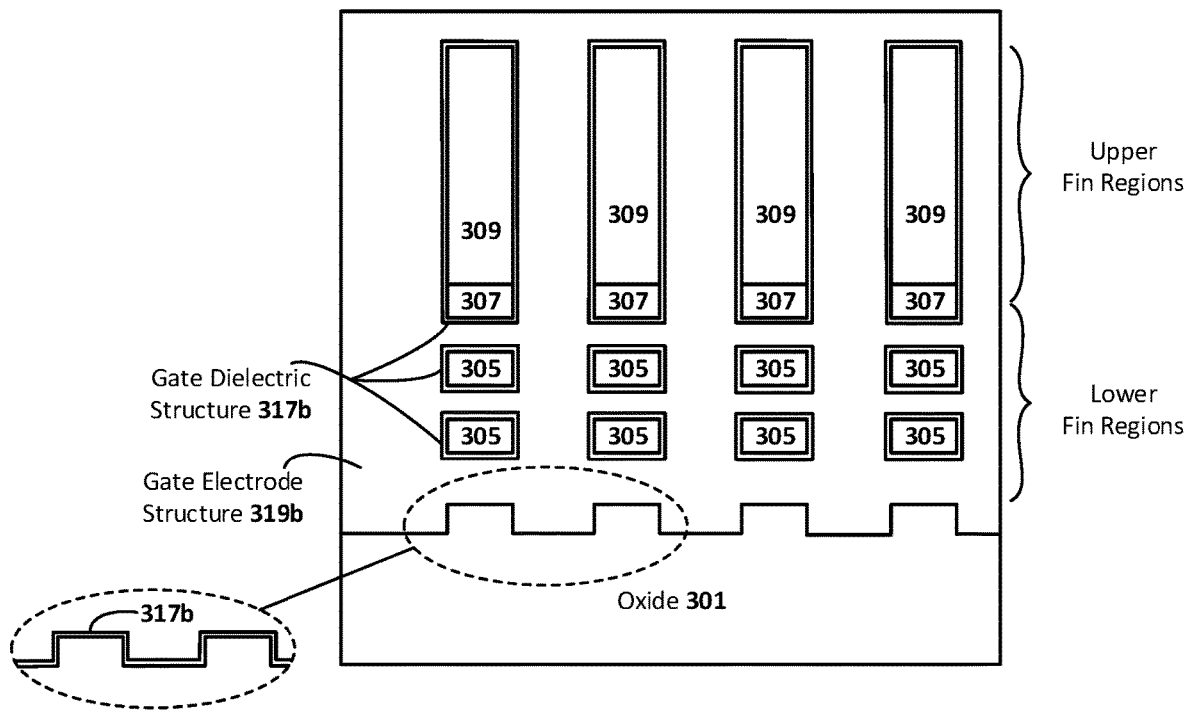

FIG. 3e shows the resulting structure after the lower device region gate structure is formed over the exposed channel regions. Standard gate structure deposition techniques can be used. As can be seen, the gate structure includes a gate dielectric 317b and a gate electrode 319b. As can be further seen, the lower gate materials may be at least partially deposited onto the upper device region channel regions, which is ok as that gate material can be subsequently removed. In the example embodiment, the gate dielectric deposition is selective, in that the gate dielectric materials are not deposited on the exposed oxide 301. In some such embodiments, note that gate dielectric materials may also not deposit on the exposed isolation region 307, depending on its composition. In other embodiments, such as shown in FIG. 3e', a non-selective deposition process can be used, that results in gate dielectric materials being deposited on all exposed surfaces, including the exposed oxide 301. The previous relevant discussion with respect to gate dielectrics 117a-b and gate electrodes 119a-b is equally applicable here, as will be appreciated.

Figure 3F:
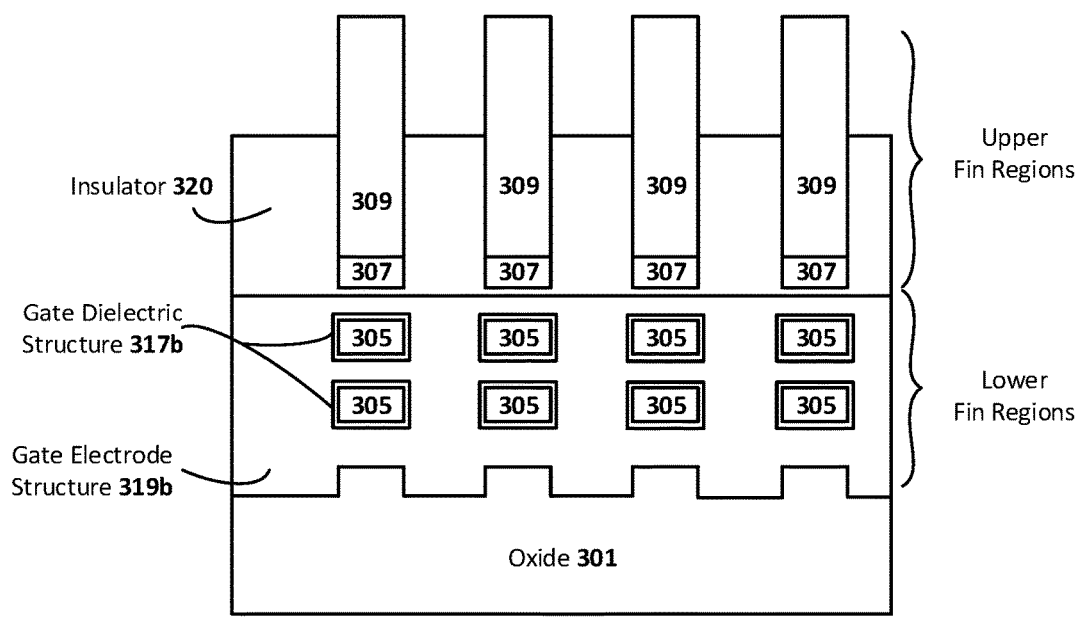
Figure 3G:
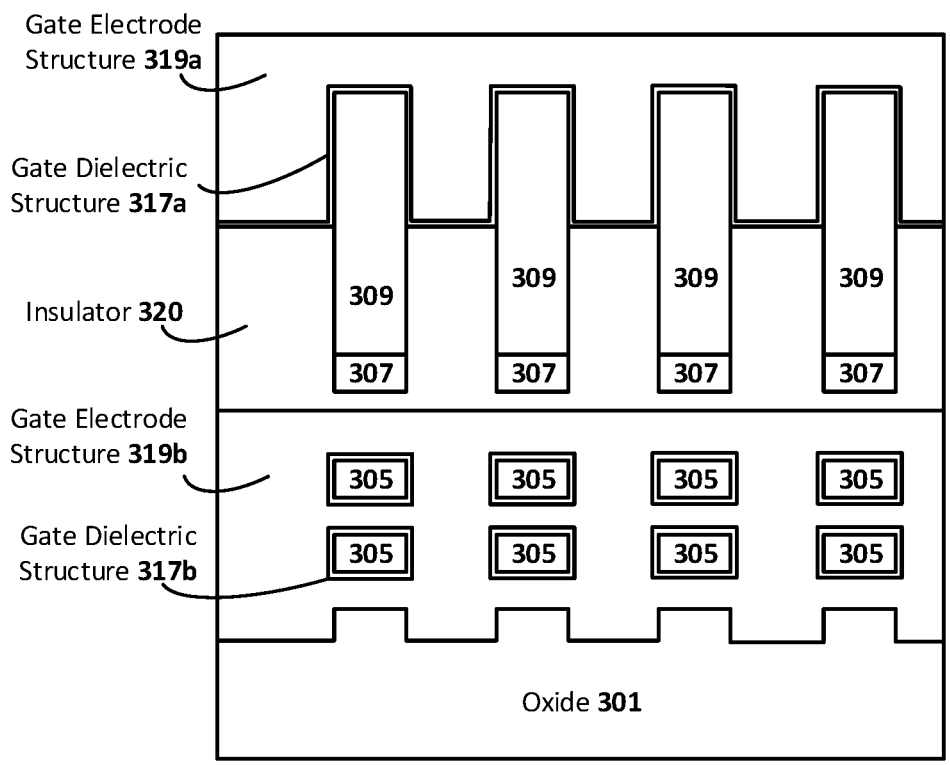
Figure 3H:
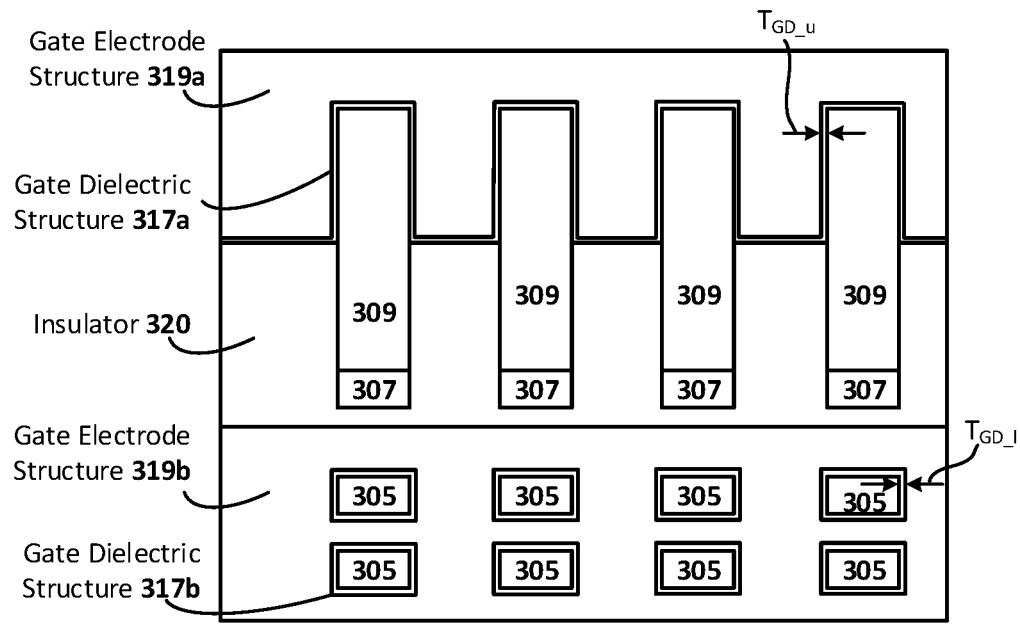

FIG. 3f shows the resulting structure after the lower gate structure materials are recessed or otherwise removed down to the lower device region, and the resulting trenches are then filled with insulator 320. The insulator 320 is then recessed to expose the upper fin regions to be gated. Standard deposition and etch techniques can be used, as will be appreciated. FIG. 3g shows the resulting structure after the upper device region gate structure is formed over the exposed channel regions. The gate structure includes a gate dielectric structure 317a and a gate electrode structure 319a. The previous relevant discussion with respect to gate dielectrics 117a-b and gate electrodes 119a-b is equally applicable here, as will be appreciated. Note how in this example embodiment that gate dielectrics 317a-b are conformal layers. In some embodiments, the thickness of the gate dielectrics 317a-b is in the range of 5 angstroms to 5 nm (such as 1 nm or 2 nm). The gate electrodes 319a-b can of course be much thicker (e.g., 10 to 50 nm). FIG. 3h shows the resulting structure after the oxide layer 301 has been removed, along with any conformal gate dielectric 317b that may have deposited thereon. As can be seen, each of gate dielectric structures 317a-b can have a thickness that is tuned ($T_G$A. and $T_{GD\_1}$), and those thicknesses may be the same or different. Numerous variations and configurations will be apparent.

As previously noted, the source/drain regions can be processed before or after the gate structures are processed. In any such cases, the source/drain regions of interest can be isolated with a patterned mask. Standard stacked transistor source/drain processing can be carried out, according to some embodiments. Alternatively, source/drain processing can be carried out in a similar fashion to the gate structure processing provided herein. For instance, the upper and lower fin regions of the fin structures can be etched away. The lower source/drain regions can then be deposited (seeding on the lower channel region, exposed by the previous etch), followed by an etch back of any extraneous source/drain materials that deposit on the upper channel region, followed by deposition of an insulator layer to isolation upper and lower source/drain regions (if desired), followed by deposition of the upper source/drain materials (seeding on the upper channel region, exposed by the previous etch). The previous relevant discussion with respect to example source/drain materials and configurations is equally applicable here. Once the upper and lower source/drain regions are formed, contact structures and any desired interconnects between upper and lower device can be provided, according to some embodiments. Such contact structures and interconnects may be formed by entering from both top and bottom surfaces of the overall structure, in some cases. Numerous configurations and variations will be apparent.

Figure 4A:
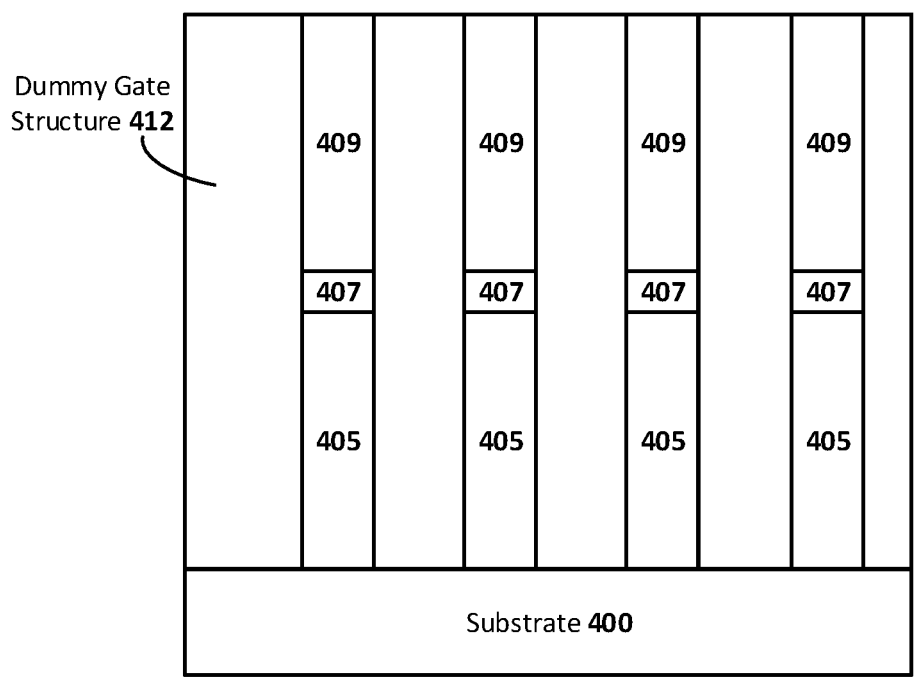
FIGS. 4a though 4g' are cross-sections views illustrating another process for forming an integrated circuit including a stacked transistor configuration in which upper and lower regions of the same fin structure are used simultaneously for separate transistor devices, in accordance with an embodiment of the present disclosure. The cross-sections are taken perpendicular to the fin structures and through the channel region.

FIGS. 4a though 4g' are cross-sections views illustrating another process for forming an integrated circuit including a stacked transistor configuration in which upper and lower regions of the same fin structure are used simultaneously for separate transistor devices, in accordance with an embodiment of the present disclosure. The cross-sections are taken perpendicular to the fin structures and through the channel region. As will be seen, this example embodiment is similar to the embodiment discussed with reference to FIGS. 3a-h, but utilizes a sacrificial material to protect the upper fin region. The lower gate structure is then deposited and recessed with the sacrificial material protecting the upper channel region. The sacrificial material is then removed and the upper gate structure is deposited. Note that the etch to remove the sacrificial material can be selected to have less deleterious effects on the upper channel region than would the etch necessary to recess the lower level gate materials (due to the nature of the etch chemistry for etching metal).

FIG. 4a shows an example structures along with dummy (sacrificial) gate materials in place. As can be seen, the fin structures include lower device regions 405 and upper device regions 409 separated by isolation region 407. The previously relevant discussion on example fin structures and materials is equally applicable here. The dummy gate structure 412 may include, a dummy gate electrode of polysilicon and a dummy gate electrode of silicon dioxide, although any number of dummy gate structure materials and configurations can be used, as will be appreciated.

Figure 4B:
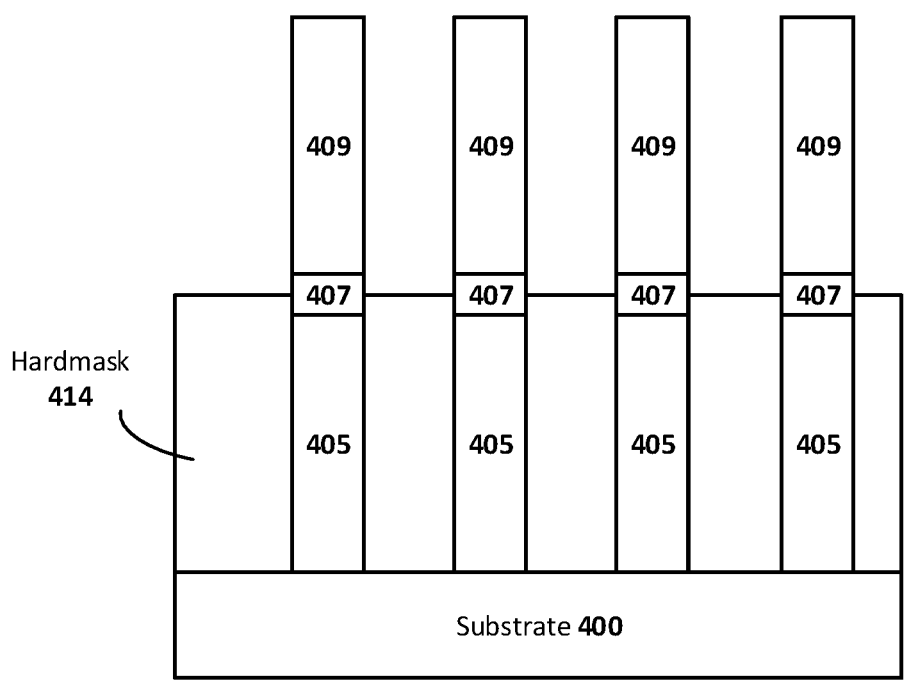
Figure 4C:
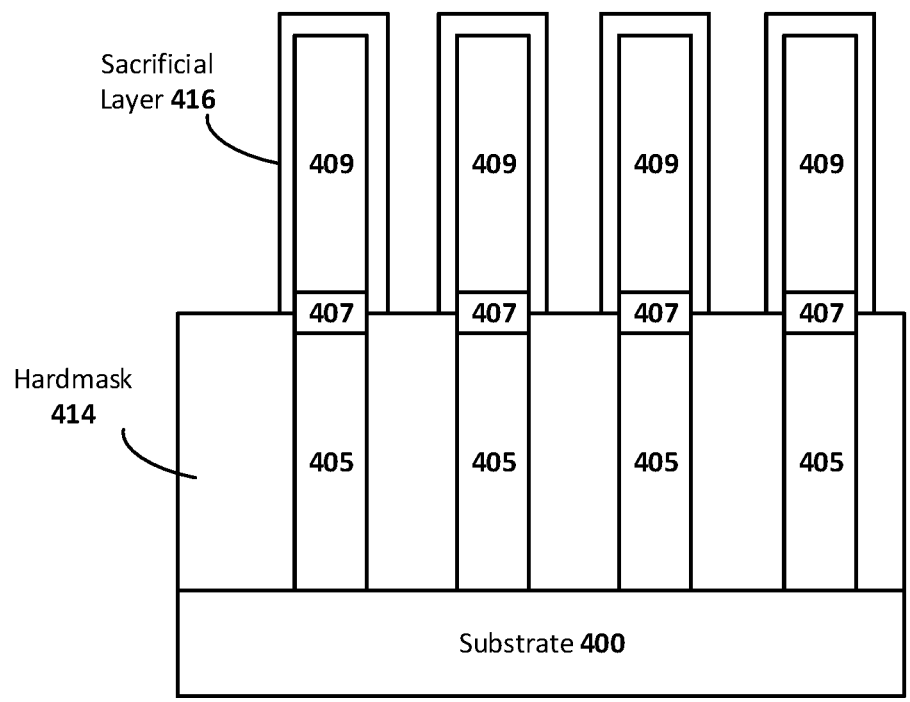

FIG. 4b shows the resulting structure after the dummy gate structure 412 material(s) are removed through the gate opening via a selective wet etch process. As can be further seen, a hardmask 414 material is deposited and recessed to the isolation region 407 level, so as to expose the upper fin regions. Standard hardmask materials and etch schemes can be used, such as silicon nitride, carbon-doped silicon oxide, or carbon-doped silicon oxynitride, or even a photoresist masking layer. FIG. 4c shows the resulting structure after sacrificial layer 416 has been deposited on to the upper fin region. In one such example embodiment, the sacrificial layer 416 material is sputtered silicon or oxide, which can protect the upper fin region during lower gate structure processing but also be removed without the need for etch chemistries that will adversely impact the upper fin region during such removal.

Figure 4D:
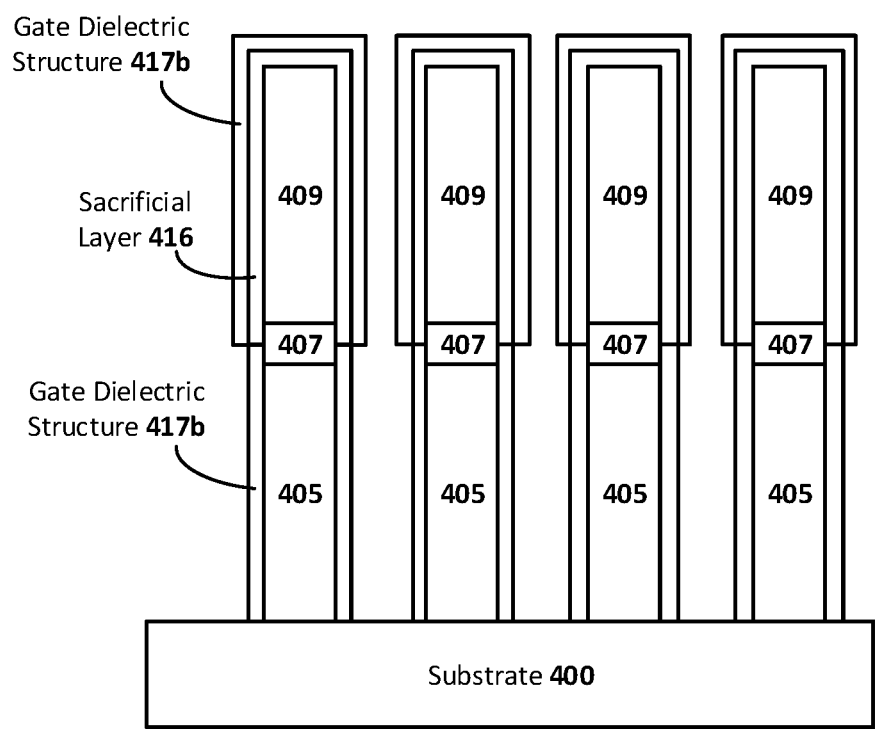
Figure 4E:
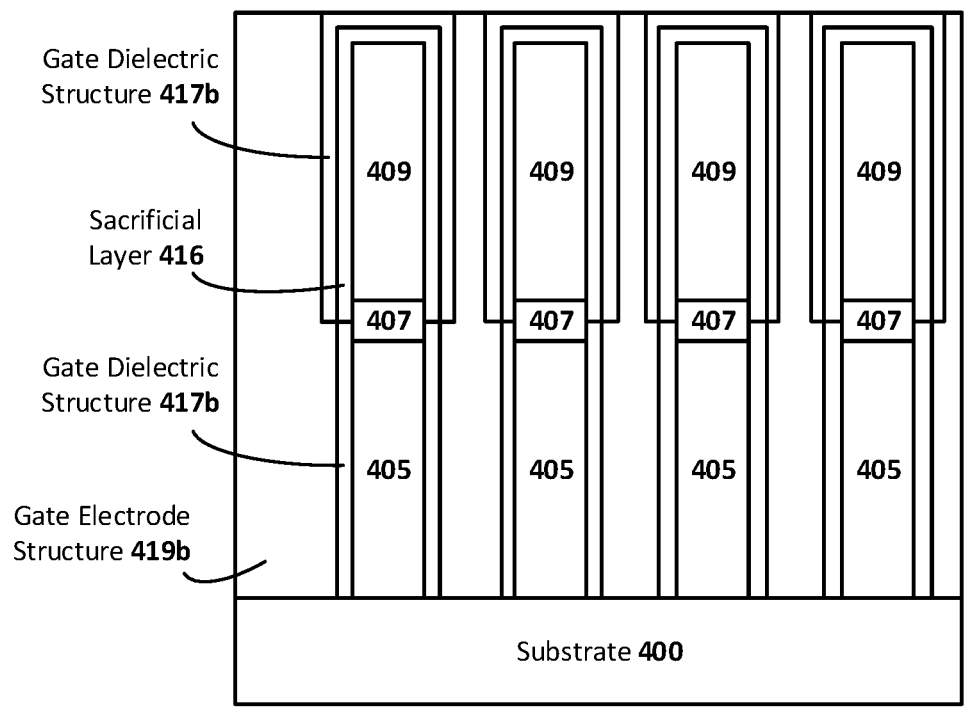

FIG. 4d shows the resulting structure after removal of the hardmask 414 and deposition of the lower gate dielectric structure 417b, and FIG. 4e shows the resulting structure after deposition of the lower gate electrode structure 419b. The previous relevant discussion with respect to example gate dielectric and gate electrode materials and structures is equally applicable here. As can be seen, the gate dielectric structure 417b material is deposited around the entire fin structure (including the top-side sacrificial layer 416), and the gate electrode structure 419b is deposited all around the gate dielectric structure 417b.

Figure 4F:
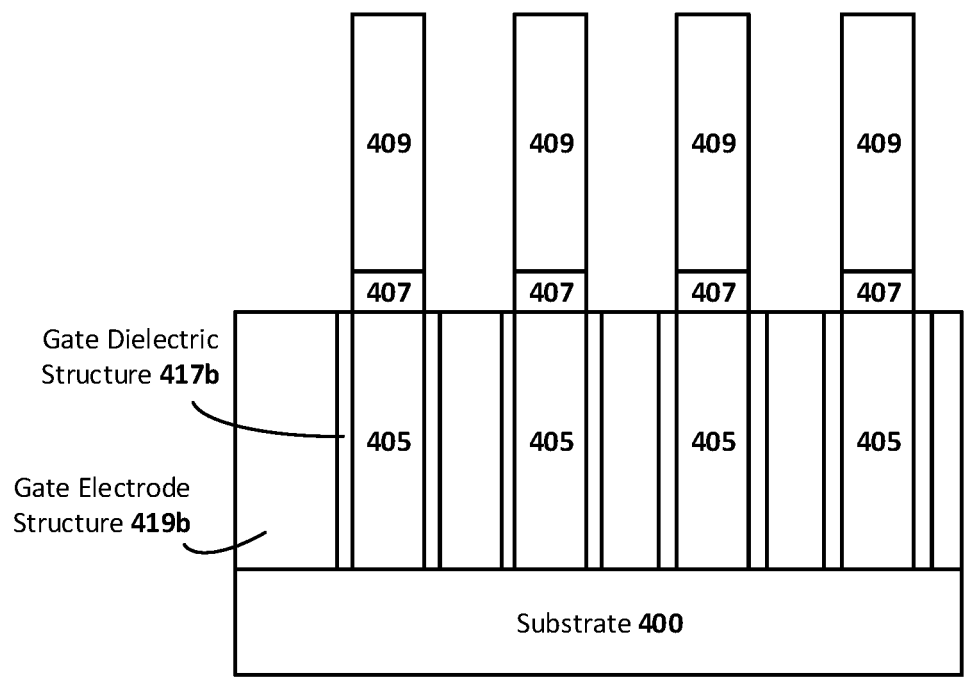

FIG. 4f shows the resulting structure after the extraneous lower gate structure materials (including dielectric structure 417b and gate electrode structure 419b) are recessed down to the isolation region 407 (in this example case, just below region 407) to re-expose sacrificial material layer 416 on the upper fin region, and after the sacrificial material layer 416 has been removed to re-expose the upper fin region. In some such example embodiments, the sacrificial material used may be a sputtered silicon layer or a polyamorphous silicon layer which may be removed with standard etch chemistry.

Figure 4G:
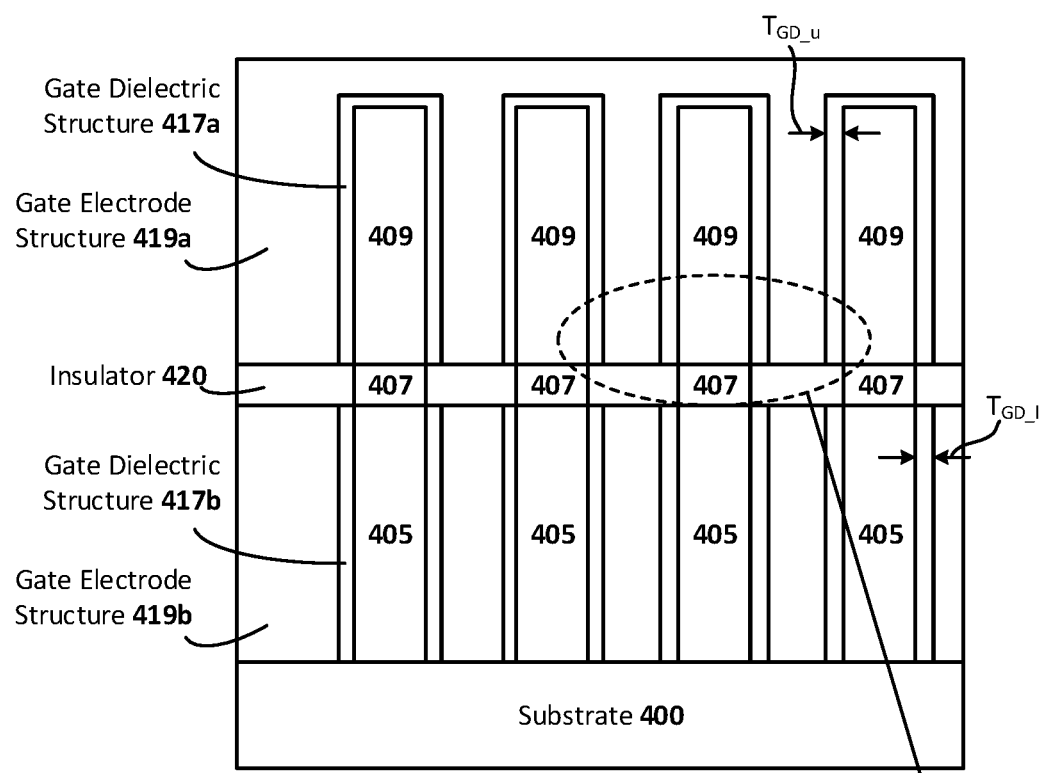
Figure 4G:
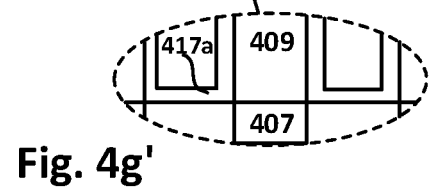

FIG. 4g shows the resulting structure after an insulator layer 420 is deposited and trimmed back, and after the upper gate structure if formed thereon (including gate dielectric structure 417a and gate electrode structure 419a). As previously explained, the gate dielectric structure 417a can be deposited in a selective fashion (as shown in FIG. 4g), or in a non-selective fashion (as shown in FIG. 4g', where gate dielectric structure 417a is also deposited on the insulator layer 420. In still other embodiments, note that insulator 420 may not be included over all or any of the lower gate structures, thereby allowing those upper and lower gate structures to be electrically connected. As can be seen, each of gate dielectric structures 417a-b can have a thickness that is tuned ($T_{GD\_u}$ and $T_{GD\_1}$), and those thicknesses may be the same or different from one another.

Computing System

Figure 5:
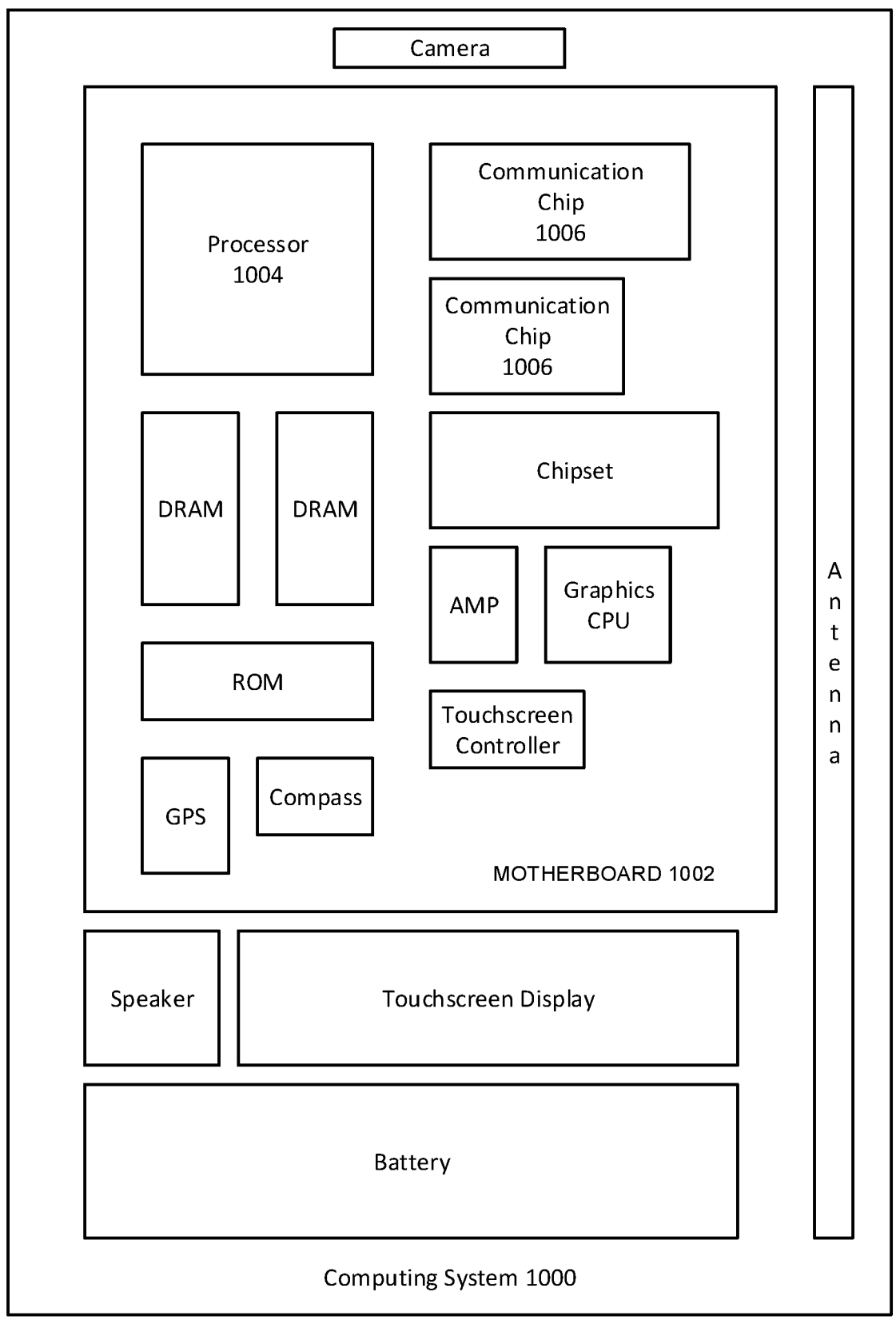
FIG. 5 illustrates a computing system implemented with one or more integrated circuit structures configured in accordance with an embodiment of the present disclosure.

FIG. 5 illustrates a computing system implemented with one or more integrated circuit structures configured in accordance with an embodiment of the present disclosure. As can be seen, the computing system 1000 houses a motherboard 1002. The motherboard 1002 may include a number of components, including but not limited to a processor 1004 and at least one communication chip 1006

(two are shown in this example), each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuits configured with a stacked transistor structure, as variously described herein. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. The processor 1004 of the computing system 1000 includes an integrated circuit die packaged within the processor 1004. In some example embodiments of the present disclosure, the integrated circuit die of the processor 1004 includes one or more stacked transistor structures as variously provided herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip 1006 includes one or more stacked transistor structures as variously provided herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs one or more stacked transistor structures as variously provided herein. As will be appreciated in light of this disclosure, various embodiments of the present disclosure can be used to improve performance on products fabricated at any process node (e.g., in the micron range, or sub-micron and beyond) by allowing for the use of vertically stacked transistors having any number of source/drain configurations and channel configurations (e.g., Si, Ge, SiGe, multilayer structure of Si and SiGe, III-V such as gallium nitride or InGaAs, a semiconducting oxide such as nickel oxide or IGZO, and/or combinations thereof).

FURTHER EXAMPLE EMBODIMENTS

The following examples pertain to further embodiments, from which numerous permutations and configurations will be apparent.

Example 1 includes an integrated circuit structure, comprising: a fin structure including an upper portion having opposing sidewalls and a lower portion having opposing sidewalls, wherein the sidewalls of the upper portion are collinear with the sidewalls of the lower portion; a first gate structure on the upper portion, the first gate structure including a first gate electrode and a first gate dielectric between the first gate electrode and the upper portion; and a second gate structure on the lower portion, the second gate structure including a second gate electrode and a second gate dielectric between the second gate electrode and the lower portion; wherein the first gate structure is different from the second gate structure with respect to at least one of composition and gate dielectric thickness.

Example 2 includes the subject matter of Example 1, wherein the first gate electrode includes a first metal and the second gate electrode includes a second metal that is compositionally different from the first metal. Other compositional differences with respect to the gate structure will be apparent, above and beyond any unintentional differences that might naturally occur.

Example 3 includes the subject matter of Example 1 or 2, wherein the first gate dielectric has a first thickness and the second gate dielectric has a second thickness that is at least 0.5 nm different from the first thickness.

Example 4 includes the subject matter of Example 3, wherein the second thickness is at least 1 nm different from the first thickness.

Example 5 includes the subject matter of any of the preceding Examples, wherein the fin structure further includes an isolation region between the upper and lower portions, the isolation region configured to provide electrical isolation between the upper and lower portions.

Example 6 includes the subject matter of Example 5, wherein the isolation region comprises insulator material.

Example 7 includes the subject matter of Example 5 or 6, wherein the isolation region comprises doping or fixed charge isolation.

Example 8 includes the subject matter of any of Examples 5 through 7, wherein the isolation region is within at least one of the upper and lower portions (e.g., either a doped region, or a region converted to an oxide, for instance).

Example 9 includes the subject matter of any of Examples 5 through 8, wherein the first gate dielectric is also between the isolation region and the gate electrode.

Example 10 includes the subject matter of any of the preceding Examples, wherein at least one of the first and second gate dielectrics comprises a high-k dielectric.

Example 11 includes the subject matter of any of the preceding Examples, wherein at least one of the first and second gate dielectrics has a thickness in the range of 5 angstroms to 2 nm.

Example 12 includes the subject matter of any of the preceding Examples, and further includes: a first source region and a first drain region adjacent the first gate structure; and a second source region and a second drain region adjacent the second gate structure.

Example 13 includes the subject matter of any of the preceding Examples, wherein the upper portion includes one or more nanowires or nanoribbons, and the first gate structure wraps around the upper portion, and the sidewalls of the upper portion include sidewalls of the one or more nanowires or nanoribbons.

Example 14 includes the subject matter of any of the preceding Examples, wherein the lower portion includes one or more nanowires or nanoribbons, and the second gate structure wraps around the lower portion, and the sidewalls of the lower portion include sidewalls of the one or more nanowires or nanoribbons.

Example 15 includes the subject matter of any of Examples 1 through 12 and 14, wherein the upper portion includes a fin, and the first gate structure is on opposing sidewalls and a top of the upper portion, and the sidewalls of the upper portion include the sidewalls of the fin.

Example 16 includes the subject matter of any of Examples 1 through 13 and 15, wherein the lower portion includes a fin, and the second gate structure is on opposing sidewalls of the lower portion, and the sidewalls of the lower portion include the sidewalls of the fin.

Example 17 includes the subject matter of any of the preceding Examples, wherein the integrated circuit structure is part of a processor or communications chip.

Example 18 includes the subject matter of any of the preceding Examples, wherein the integrated circuit structure is part of a mobile communications device, such as a smart phone, tablet, or laptop.

Example 19 is an integrated circuit structure, comprising: a fin structure including an upper portion in the form of a fin, nanowire, or nanoribbon and a lower portion in the form of a fin, nanowire, or nanoribbon, wherein sidewalls of the upper portion are collinear with sidewalls of the lower portion; a first gate structure at least on the sidewalls of the upper portion, the first gate structure including a first gate electrode and a first gate dielectric, the first gate dielectric between the first gate electrode of the upper portion, the first gate electrode including a first metal, and the first gate dielectric having a first thickness; a first source region and a first drain region adjacent the first gate structure; a second gate structure on the sidewalls of the lower portion, the second gate structure including a second gate electrode and a second gate dielectric, the second gate dielectric between the second gate electrode and the lower portion, the second gate electrode including a second metal that is compositionally different from the first metal, and the second gate dielectric having a second thickness that is at least 1 nm different from the first thickness; and a second source region and a second drain region adjacent the second gate structure.

Example 20 includes the subject matter of Example 19, wherein the fin structure further includes an isolation region between the upper and lower portions, the isolation region comprising an insulator material or a dopant.

Example 21 includes the subject matter of Example 20, wherein the first gate dielectric is also between the isolation region and the gate electrode.

Example 22 includes the method for providing an integrated circuit structure, the method comprising: forming a fin structure including an upper portion in the form of a fin, nanowire, or nanoribbon and a lower portion in the form of a fin, nanowire, or nanoribbon, wherein sidewalls of the upper portion are collinear with sidewalls of the lower portion; depositing a sacrificial protective layer on the upper portion; forming a lower gate structure on the sidewalls of the lower portion, the lower gate structure including a lower gate electrode and a lower gate dielectric, the lower gate dielectric between the lower gate electrode and the lower portion; removing lower gate structure materials and the sacrificial protective layer from the upper portion; and forming an upper gate structure on the sidewalls of the upper portion, the upper gate structure including an upper gate electrode and an upper gate dielectric, the upper gate dielectric between the upper gate electrode and the upper portion.

Example 23 includes the subject matter of Example 22, wherein the upper gate electrode includes a first metal and the lower gate electrode includes a second metal that is compositionally different from the first metal.

Example 24 includes the subject matter of Example 22 or 23, wherein the upper gate dielectric has a first thickness and the lower gate dielectric has a second thickness that is at least 0.5 nm different from the first thickness.

Example 25 includes the subject matter of Example 24, wherein the second thickness is at least 1 nm different from the first thickness.

Example 26 includes the subject matter of any of Examples 22 through 25, wherein the fin structure further includes an isolation region between the upper and lower portions.

Example 27 includes the subject matter of Example 26, wherein the isolation region comprises insulator material.

Example 28 includes the subject matter of Example 26 or 27, wherein the isolation region comprises doping or fixed charge isolation.

Example 29 includes the subject matter of any of Examples 26 through 28, wherein the isolation region is within at least one of the upper and lower portions.

Example 30 the subject matter of any of Examples 26 through 29, wherein the upper gate dielectric is also between the isolation region and the gate electrode.

Example 31 includes the subject matter of any of Examples 22 through 30, wherein at least one of the upper and lower gate dielectrics comprises a high-k dielectric.

Example 32 includes the subject matter of any of Examples 22 through 31, wherein at least one of the upper and lower gate dielectrics has a thickness in the range of 5 angstroms to 2 nm.

Example 33 includes the subject matter of any of Examples 22 through 32, and further includes: forming an upper source region and an upper drain region adjacent the upper gate structure; and forming a lower source region and a lower drain region adjacent the lower gate structure.

Example 34 includes the subject matter of any of Examples 22 through 33, wherein the upper portion includes one or more nanowires or nanoribbons, and the upper gate structure wraps around the upper portion, and the sidewalls of the upper portion include sidewalls of the one or more nanowires or nanoribbons.

Example 35 includes the subject matter of any of Examples 22 through 34, wherein the lower portion includes one or more nanowires or nanoribbons, and the lower gate structure wraps around the lower portion, and the sidewalls of the lower portion include sidewalls of the one or more nanowires or nanoribbons.

Example 36 includes the subject matter of any of Examples 22 through 33 and 35, wherein the upper portion includes a fin, and the upper gate structure is on opposing sidewalls and a top of the upper portion, and the sidewalls of the upper portion include the sidewalls of the fin.

Example 37 includes the subject matter of any of Examples 22 through 34 and 36, wherein the lower portion includes a fin, and the lower gate structure is on opposing sidewalls of the lower portion, and the sidewalls of the lower portion include the sidewalls of the fin.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit structure, comprising:
a fin structure including an upper portion having opposing sidewalls and a lower portion having opposing sidewalls, wherein the sidewalls of the upper portion are collinear with the sidewalls of the lower portion;
a first gate structure on the upper portion, the first gate structure including a first gate electrode and a first gate dielectric between the first gate electrode and the upper portion; and
a second gate structure on the lower portion, the second gate structure including a second gate electrode and a second gate dielectric between the second gate electrode and the lower portion; wherein the first gate structure is different from the second gate structure with respect to at least one of composition or gate dielectric thickness, and wherein the second gate structure is in direct contact with the first gate structure.

2. The integrated circuit structure of claim 1, wherein the first gate electrode includes a first metal and the second gate electrode includes a second metal that is compositionally different from the first metal.

3. The integrated circuit structure of claim 1, wherein the first gate dielectric has a first thickness and the second gate dielectric has a second thickness that is at least 0.5 nm different from the first thickness.

4. The integrated circuit structure of claim 3, wherein the second thickness is at least 1 nm different from the first thickness.

5. The integrated circuit structure of claim 1, wherein the fin structure further includes an isolation region between the upper and lower portions, the isolation region configured to provide electrical isolation between the upper and lower portions.

6. The integrated circuit structure of claim 5, wherein the isolation region comprises insulator material.

7. The integrated circuit structure of claim 5, wherein the isolation region comprises doping or fixed charge isolation.

8. The integrated circuit structure of claim 5, wherein the isolation region is within at least one of the upper and lower portions.

9. The integrated circuit structure of claim 5, wherein the first gate dielectric is also between the isolation region and the first gate electrode.

10. The integrated circuit structure of claim 1, wherein at least one of the first and second gate dielectrics comprises a high-k dielectric.

11. The integrated circuit structure of claim 1, wherein at least one of the first and second gate dielectrics has a thickness in the range of 5 angstroms to 2 nm.

12. The integrated circuit structure of claim 1, further comprising: a first source region and a first drain region adjacent the first gate structure; and a second source region and a second drain region adjacent the second gate structure.

13. The integrated circuit structure of claim 1, wherein the upper portion includes one or more nanowires or nanoribbons, and the first gate structure wraps around the upper portion, and the sidewalls of the upper portion include sidewalls of the one or more nanowires or nanoribbons.

14. The integrated circuit structure of claim 1, wherein the lower portion includes one or more nanowires or nanoribbons, and the second gate structure wraps around the lower portion, and the sidewalls of the lower portion include sidewalls of the one or more nanowires or nanoribbons.

15. The integrated circuit structure of claim 1, wherein the upper portion includes a fin, and the first gate structure is on opposing sidewalls and a top of the upper portion, and the sidewalls of the upper portion include the sidewalls of the fin.

16. The integrated circuit structure of claim 1, wherein the lower portion includes a fin, and the second gate structure is on opposing sidewalls of the lower portion, and the sidewalls of the lower portion include the sidewalls of the fin.

17. The integrated circuit structure of claim 1, wherein the integrated circuit structure is part of a processor or communications chip.

18. The integrated circuit structure of claim 1, wherein the integrated circuit structure is part of a mobile communications device.

19. An integrated circuit structure, comprising:
a fin structure including an upper portion in the form of a fin, nanowire, or nanoribbon and a lower portion in the form of a fin, nanowire, or nanoribbon, wherein sidewalls of the upper portion are collinear with sidewalls of the lower portion;
a first gate structure at least on the sidewalls of the upper portion, the first gate structure including a first gate electrode and a first gate dielectric, the first gate dielectric between the first gate electrode of the upper portion, the first gate electrode including a first metal, and the first gate dielectric having a first thickness;
a first source region and a first drain region adjacent the first gate structure;
a second gate structure on the sidewalls of the lower portion, the second gate structure including a second gate electrode and a second gate dielectric, the second gate dielectric between the second gate electrode and the lower portion, the second gate electrode including a second metal that is compositionally different from the first metal, and the second gate dielectric having a second thickness that is at least 1 nm different from the first thickness, and wherein the second gate structure is in direct contact with the first gate structure; and a second source region and a second drain region adjacent the second gate structure.

20. The integrated circuit structure of claim 19, wherein the fin structure further includes an isolation region between the upper and lower portions, the isolation region comprising an insulator material or a dopant, and the first gate dielectric is also between the isolation region and the first gate electrode.

\* \* \* \* \*